United States Patent [19]

Kawagishi et al.

[11] Patent Number: 5,274,475
[45] Date of Patent: Dec. 28, 1993

[54] INFORMATION TRANSFER METHOD, INFORMATION TRANSFER APPARATUS, AND ITS DRIVING METHOD

[75] Inventors: Hideyuki Kawagishi, Ayase; Kunihiro Sakai, Isehara; Kiyoshi Takimoto, Kawasaki; Hisaaki Kawade, Atsugi; Ken Eguchi, Yokohama, all of Japan

[73] Assignee: Canon Kabushiki Kaisha, Tokyo, Japan

[21] Appl. No.: 679,103

[22] Filed: Apr. 2, 1991

[30] Foreign Application Priority Data

| Apr. 3, 1990 | [JP] | Japan | 2-87395 |
| Apr. 3, 1990 | [JP] | Japan | 2-87396 |
| Apr. 3, 1990 | [JP] | Japan | 2-87397 |
| Apr. 3, 1990 | [JP] | Japan | 2-87398 |

[51] Int. Cl.$^5$ .................................. G02F 1/133
[52] U.S. Cl. ............................ 358/471; 359/79
[58] Field of Search .............. 358/471; 359/79, 58, 359/87; 423/446; 340/784

[56] References Cited

U.S. PATENT DOCUMENTS

| 4,413,883 | 11/1983 | Baraff et al. | 359/58 |
| 4,523,811 | 6/1985 | Ota | 359/58 |
| 4,861,141 | 8/1989 | Nakazawa | 359/79 |
| 5,101,288 | 3/1992 | Ohta et al. | 359/79 |
| 5,117,299 | 5/1992 | Kondo et al. | 359/79 |
| 5,142,390 | 8/1992 | Ohta et al. | 359/79 |
| 5,153,753 | 10/1992 | Ohta et al. | 359/58 |

FOREIGN PATENT DOCUMENTS

| 0330395 | 8/1989 | European Pat. Off. |
| 63-96956 | 4/1988 | Japan |
| 63-161553 | 7/1988 | Japan |
| 2065406 | 6/1981 | United Kingdom |

OTHER PUBLICATIONS

"Electronic Devices And Circuit Theory, Fourth Edition", Boylestad et al., Prentice-Hall, Inc., Englewood Cliffs, N.J., 1987, pp. 138–140.

IBM Technical Disclosure Bulletin, "Logarithmic Humidity Sensor Amplifier", D. West, vol. 27, No. 8, 1985, pp. 4792–4793.

Philips Technical Review, "The 'bucket-brigade delay line', A Shift Register For Analogue Signals", F. L. J. Sangster, vol. 31, No. 4, 1970, pp. 97–111.

*Primary Examiner*—Stephen Brinich
*Attorney, Agent, or Firm*—Fitzpatrick, Cella, Harper & Scinto

[57] ABSTRACT

An information transfer method comprises connecting a plurality of MIM devices comprising a monomolecular film of an organic compound or built-up films thereof as the insulating layer and having the switching memory function, and transferring the information on the side nearer to the oscillation source of the information every second bit or every second line or every second picture face successively to the side farther from the oscillation source. An information transfer apparatus comprises using an array or a plurality of arrays of circuits with devices having rectifiability connected in series with the rectifying directions being aligned, connecting one terminal of a two-terminal circuit having an MIM device having switching memory function to each connecting point A, connecting the other terminal of every odd number to provide a second terminal, and having a voltage application means capable of taking a disconnected state relative to the connecting point A.

33 Claims, 10 Drawing Sheets

FIG. 5A
a+b DEVICE
(OR DEVICE)
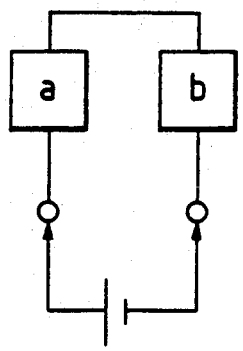
FIG. 5B
| BEFORE OPERATION | | AFTER OPERATION |
|---|---|---|
| a | b | b |
| 0 | 0 | 0 |
| 0 | 1 | 1 |
| 1 | 0 | 1 |
| 1 | 1 | 1 |
FIG. 5C
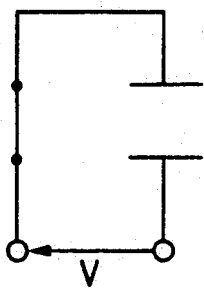
OFF(A) STATE          OFF(B) STATE
[STATE 1]              [STATE 0]
FIG. 5D
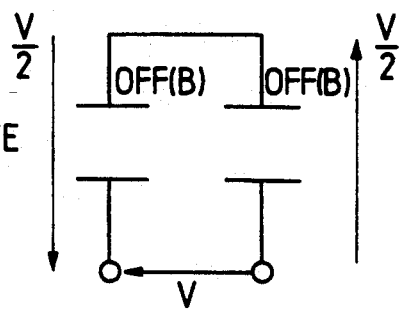

INFORMATION TRANSFER METHOD, INFORMATION TRANSFER APPARATUS, AND ITS DRIVING METHOD

BACKGROUND OF THE INVENTION

Field of the Invention

This invention relates to an information transfer method of an image information in, for example, still video, etc., an information transfer apparatus, and its driving method.

Also, the present invention pertains to an information transfer apparatus to be applied to, for example, a still video apparatus, a copying machine, etc.

Related Background Art

In the prior art, a MIM device (switching LB-MIM device) having a switching memory function with an LB film (Langmuir-Blodgett's film) as the insulation film has been proposed in Japanese Patent Application Laid-open No. 63-96956.

About how the devices by use of such LB film can be specifically incorporated into the system in order to surpass the group of apparatus related to electronics techniques which have been developed with inorganic semiconductors as the center in the prior art, the study is still at the stage when just begun.

As an example, there may be only mentioned the fact that great memory ability can be exhibited by making an access of an organic thin film having switching memory function by an STM apparatus as proposed in Japanese Patent Application Laid-open No. 63-161553.

One of the specific features of such organic thin film is that a large area can be prepared more uniformly as compared with inorganic semiconductors, but even if a thin film with a large area can be formed and may potentially have a great memory capability, without an appropriate access means, no practically great memory ability can be exhibited.

As an example conceivable as the access means, there may be mentioned an example in which matrix circuits are assembled and the respective intersecting points of the matrix are used as memory.

However, in such case, the memory capacity obtained is only about square of the number of wirings from outside.

On the other hand, there has been proposed the charge transfer system known as the bucket brigade device (abbreviated as BBD) in which charging and discharging of a capacitor are performed every other bit, in Sangster, F. J., Philips Tech. Review 31 97–110 (1970).

However, in such information transfer system (method), when the power voltage is made an OFF state, the capacitor discharges the charges with time, whereby there has been involved that no information can be stored for a long time within the BBD.

SUMMARY OF THE INVENTION

Accordingly, an object of the present invention is to provide an information transfer method, an information transfer device and a driving method thereof which can store information semi-permanently even if placed under OFF state which has cancelled the problems as described above.

Another object of the present invention is to provide an information transfer apparatus of a new type which can draw out potentially great memory capacity based on large area of organic thin film, having high capacity as well as high reliability and yet is excellent in bulk productivity with small number of wirings from outside.

The above objects can be accomplished by the present invention as specified below.

In the first place, there is provided an information transfer method, which comprises connecting a plurality of MIM devices comprising a monomolecular film of an organic compound or built-up films thereof as the insulating layer and having the switching memory function, and transferring the information on the side nearer to the oscillation source of the information every second bit or every second line or every second picture face successively to the side farther from the oscillation source.

Secondly, there is provided an information transferring method, which comprises transferring an information in an electrical circuit having a devices and b devices which are MIM devices comprising a monomolecular film of an organic compound or built-up films thereof as the insulating layer and having the switching memory function arrayed alternately in a row or in a plurality of rows, wherein the memory in the b devices is erased to effect information transmission from the a devices positioned immediately before said b device to said b device, and subsequently the memory in the a device is erased to effect information transmission from the b device positioned immediately before said a device to said a device.

Thirdly, there is provided an information transfer apparatus comprising using an array or a plurality of arrays of circuits with devices having rectifiability connected in series with the rectifying directions being aligned, connecting one terminal of a two-terminal circuit having an MIM device having switching memory function to each connecting point A, connecting the other therminal of every odd number to provide a second terminal, and having a voltage application means capable of taking a disconnected state relative to said connecting point A.

Fourthly, there is provided a method for driving an information transfer apparatus according to the second or the third invention, which comprises, as the first period, applying a voltage for making the MIM device of the information transfer address under the first state simultaneously with holding the information of the MIM device of the information transfer source and, as the second period, a voltage for information transfer is applied.

Fifthly, there is provided an information transfer apparatus comprising an MIM device comprising a monomolecular film of an organic compound or a built-up film thereof as the insulating film, a circuit having a device of which electrical resistance varied depending on the input information connected and a voltage application means.

Sixthly, there is provided an information transfer apparatus, comprising an MIM device comprising a monomolecular film of an organic compound or built-up films thereof as the insulating film and having the switching memory function at each connecting point of a circuit with devices having rectifiability connected with their rectifying directions aligned, a circuit with a device of which electrical resistance varies depending on the input information arranged on one end thereof and a resistor on the other end, respectively, and a voltage application means.

Seventhly, there is provided an information transfer apparatus comprising an MIM device comprising a monomolecular film of an organic compound or built-up films thereof as the insulating layer and having switching memory function, a circuit having a device of which electrical resistance varies with temperature connected thereto and a voltage application means.

Eighthly, there is provided an information transfer apparatus, comprising an MIM device comprising a monomolecular film of an organic compound or built-up films thereof as the insulating film and having the switching memory function arranged at each connecting point of a circuit with devices having rectifiability connected with their rectifying directions aligned, a circuit with a device of which electrical resistance varies with temperature arranged on one end thereof and a resistor on the other end, respectively, and a voltage application means.

Ninthly, there is provided an information transfer apparatus comprising an MIM device comprising a monomolecular film of an organic compound or built-up films thereof as the insulating layer and having switching memory function, a circuit having a photoconductive device connected thereto and a voltage application means.

Tenthly, there is provided an information transfer apparatus, comprising an MIM device comprising a monomolecular film of an organic compound or built-up films thereof as the insulating film and having the switching memory function arranged at each connecting point of a circuit with devices having rectifiability connected with their rectifying directions aligned, a circuit with a photoconductive arranged on one end thereof and a resistor on the other end, respectively, and a voltage application means.

Eleventhly, there is provided an information transfer apparatus, comprising an MIM device comprising a monomolecular film of an organic compound or built-up films thereof as the insulating film and having the switching memory function arranged at each connecting point of a circuit with devices having rectifiability connected with their rectifying directions aligned, a circuit with a photoconductive arranged on one end thereof and a resistor on the other end, respectively, a voltage application means, an information holding member having an image information, a movement amount detecting device for detecting the movement amount of said information holding member, a linear light source and an optical system for inputting the image information into the photoconductive device by reflecting the light from said linear light source.

Twelfthly, there is provided an information transfer apparatus, comprising a monomolecular film of an organic compound or built-up films thereof as the insulating layer and having switching memory function, a circuit having a device of which electrical resistance varies with humidity connected thereto and a voltage application means.

Thirteenthly, there is provided an information transfer apparatus, comprising an MIM device comprising a monomolecular film of an organic compound or built-up films thereof as the insulating film and having the switching memory function arranged at each connecting point of a circuit with devices having rectifiability connected with their rectifying directions aligned, a circuit with a device of which electrical resistance varies with humidity arranged on one end thereof and a resistor on the other end, respectively, and a voltage application means.

BRIEF DESCRIPTION OF THE DRAWINGS

FIGS. 5A-5D are diagrams for illustration of the principle of information transfer.

DETAILED DESCRIPTION OF THE PREFERRED EMBODIMENTS

Figure 1:
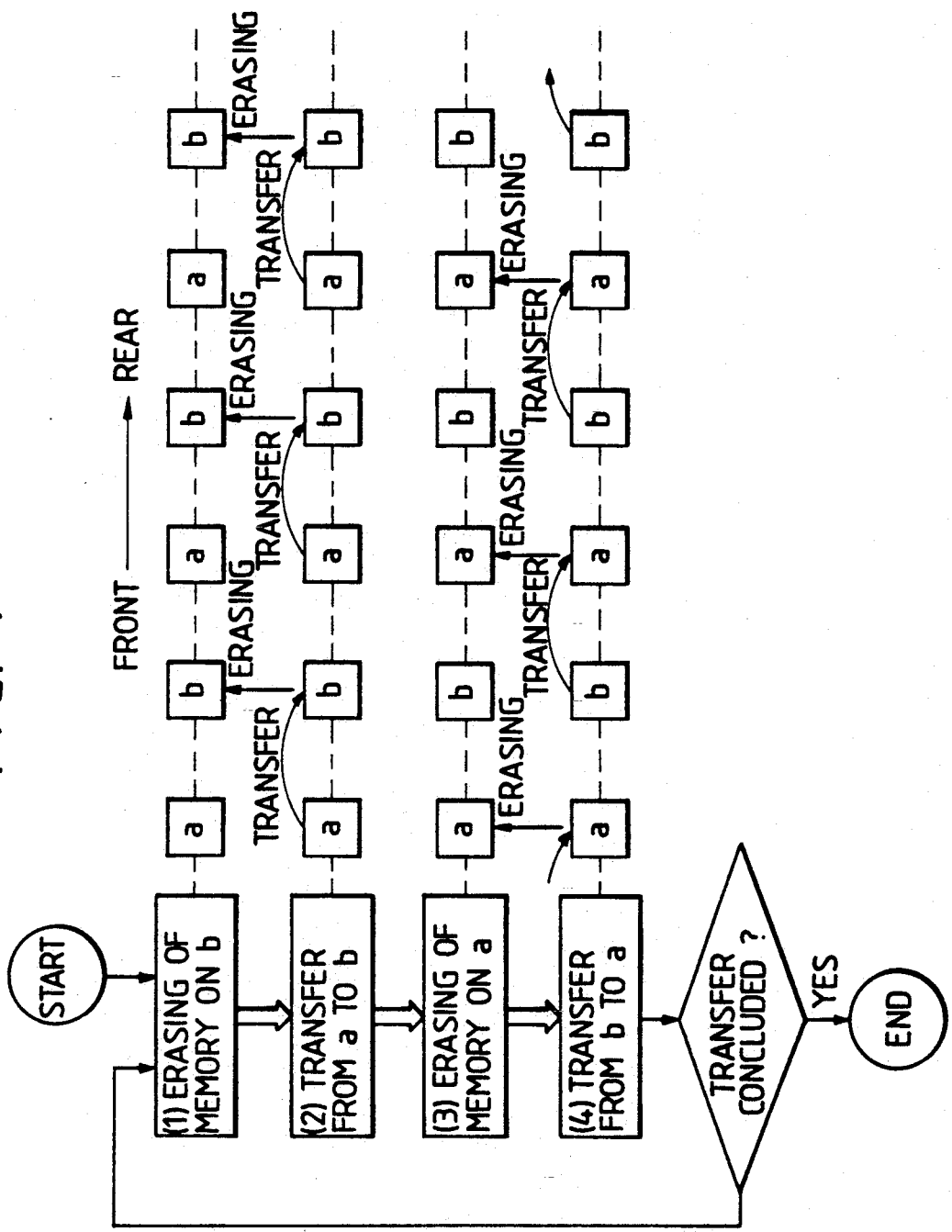
FIG. 1 is a diagram showing an example of the information transfer method of the present invention.

More specifically, according to the present invention, by use of an MIM device having switching memory function with a monomolecular film of an organic compound or built-up films thereof as the insulation layer (switching LB-MIM device), the information in the front is successively transfer memorized at every other bit or every other line or every other picture face, successively, to the rear, whereby the information is adapted to be stored semi-permanently within the switching LB-MIM device even if the power source voltage may be made to an OFF state.

Further, according to the present invention, by applying a voltage on a circuit connected in series with an MIM device having switching memory function (switching LB-MIM device) as described above and a device of which electrical resistance varies depending on the input information, the input information can be transferred to the switching LB-MIM device to be memorized therein, and the memorized information will be stored semi-permanently even if the power voltage may be made to an OFF state.

The input information as mentioned in the present invention refers to temperature, humidity, light, etc.

The switching memory function as mentioned in the present invention refers to the function of enabling reversibly transition (switching) to the low resistance state and the high resistance state and yet capable of holding (memorizing) the respective states even when application of the voltage may be stopped by applying a voltage exceeding the threshold value capable of transitioning the state exhibiting two or more electroconductivities different from each other under the state where a thin film such as an organic monomolecular film, built-up films thereof, etc. is arranged between a pair of electrodes.

In such present invention, applicable organic compounds may include organic materials having a group having $\pi$-electron conjugation system which system is suitable for the present invention, and examples of the structure of the dye having the $\pi$-electron conjugation system may include dyes having porphyrin skelton such as phthalocyanine, tetraphenyl-porphyrin, etc., azulene type dyes having squarylium group and croconicmethine group as the linking chain and dyes analogous to cyanine type having 2 nitrogens containing heterocyclic rings such as quinoline, benzothiazole, benzooxazole bonded through squarylium group and croconicmethine group, or fused polycyclic aromatic compounds such as cyanine dyes, anthracene and pyrene, etc., and linear compounds comprising polymers of aromatic and heterocyclic compounds and polymers of diacetylene groups, further derivatives of tetracynoquinodimethane or tetrathiafluvalene and analogues thereof and charge transfer complexes thereof, and further metal complex compounds such as ferrocene, trisbipyridine luthenium complexes, etc.

As the polymeric material suitable for the present invention, for example, there may be included biological polymers of addition polymers such as polyacrylic acid derivatives, etc., condensed polymers such as polyimide, etc., ring-opened polymers such as nylon, etc.

Concerning formation of the above insulation layer, although specifically the vapor deposition method, the cluster ion beam method, etc. can be applied, the Langmuir-Blodgett's (LB) method may be extremely suitably employed for controllability, easiness and reproducibility.

According to the LB method, a monomolecular film of an organic compound having hydrophobic sites and hydrophilic sites in one molecule or built-up films thereof can be formed easily on a substrate, and also a uniform, homogeneous organic ultra-thin film having a thickness of molecular order and over a large area can be stably supplied.

The LB method is a method for forming a monomolecular film or built-up films thereof by utilizing the fact that when in a molecule with a structure having hydrophilic sites and hydrophobic sites, when the balance between the two (amphiphilic balance) is adequately maintained, the molecule will become a layer of monomolecular film with the hydrophilic groups directed downwardly.

As the group for constituting the hydrophobic sites, there may be included various hydrophobic groups generally and widely known in the art such as saturated and unsaturated hydrocarbon groups or fused polycyclic aromatic groups and chain polycyclic phenyl groups, etc. These will constitute the hydrophobic sites individually or as a combination of a plurality thereof. On the other hand, as the most representative of the constituents of hydrophobic sites, there may be included hydrophilic groups such as carboxyl group, ester group, acid amide group, imide group, hydroxyl group, further amino groups (primary, secondary, tertiary and quaternary).

An organic molecule having these hydrophobic groups and hydrophilic groups in combination with good balance can form a monomolecular film on the water surface, and can be an extremely suitable material for the present invention.

The switching memory characteristic of the compounds having these $\pi$-electron conjugation systems can be observed even with a film thickness of some 10 nm or less, but the thickness should be preferably made 5 to 300 Å from film forming property, uniformity, etc.

As the electrode material constituting the MIM device, it is preferably formed of noble metals such as Au, Pt, Pd, etc. which will not form insulating oxides on the electrodes (generally electrodes deposited on the support substrate) on which monomolecular film or built-up films thereof are formed, or electroconductive oxides such as ITO, etc.

Referring now to Examples, the present invention is described in detail.

EXAMPLE 1

FIG. 1 is a diagram showing best the specific features of the information transfer method which is the present invention, particularly an information transfer method in an electrical circuit with a devices and b devices which are switching LB-MIM devices of the same kind being juxtaposed in a row in the order of ... ababab ... (or a plurality of rows), characterized in that:

(1) first, the memory of a b device is erased,
(2) an information is transferred from an a device to the adjoining rear b device,
(3) subsequently, the memory in the a device is erased, and
(4) an information is transferred from the b device to the adjoining rear a device.

Figure 6:
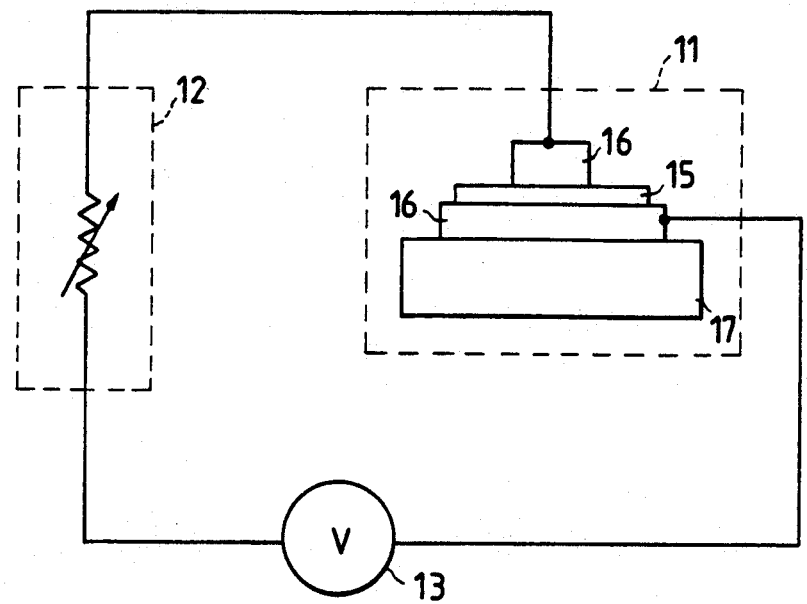
FIG. 6 is a diagram showing the basic constitution of the apparatus according to another embodiment of the present invention.

Here, as the a device and the b device, as shown in FIG. 6, 11, a switching LB-MIM device having a constitution of (upper electrode) 16/SOAZ (squarylium type dye) layer LB film 15/Au (lower electrode) 16 were employed.

Such MIM device was prepared as described below.

First, on a glass substrate 17 (#7059 produced by Corning) subjected to the hydrophobic treatment by leaving it to stand in the saturated vapor of hexamethyldisilazane (HMDS) one day and night was deposited Cr as the subbing layer to a thickness of 500 Å by the vacuum vapor deposition method, further vapor deposited Au (film thickness 1000 Å) by the same method to form a stripe-shaped subbing electrode 16 to a width of 1 mm. By use of such substrate as the carrier, monomolecular films of squarylium-bis-6-octylazulene (SOAZ) were built up by the LB method. The method for building up films is described in detail below.

A solution of SOAZ dissolved at a concentration of 0.2 mg/ml in chloroform was spread onto an aqueous phase with a water temperature of 20° C. to form a monomolecular film on the water surface. Having awaited evaporation of the solvent, the surface pressure of the monomolecular film was enhanced to 20 mN/m, and further the above substrate was dipped in the direction transversing the water surface gently at a speed of 10 mm/min., and subsequently drawn up gently at 5 mm/min. to build up two layers of Y-type monomolecular films. Then, this was repeated to build up 12 layers, thus forming an insulating layer (LB film) 15.

Next, on such film surface is vacuum vapor deposited a stripe-shaped Al (film thickness 1500 Å) with a width of 1 mm so as to be crossed at right angle, while maintaining the substrate temperature at room temperature or lower, to form an upper electrode 16.

Figure 2:
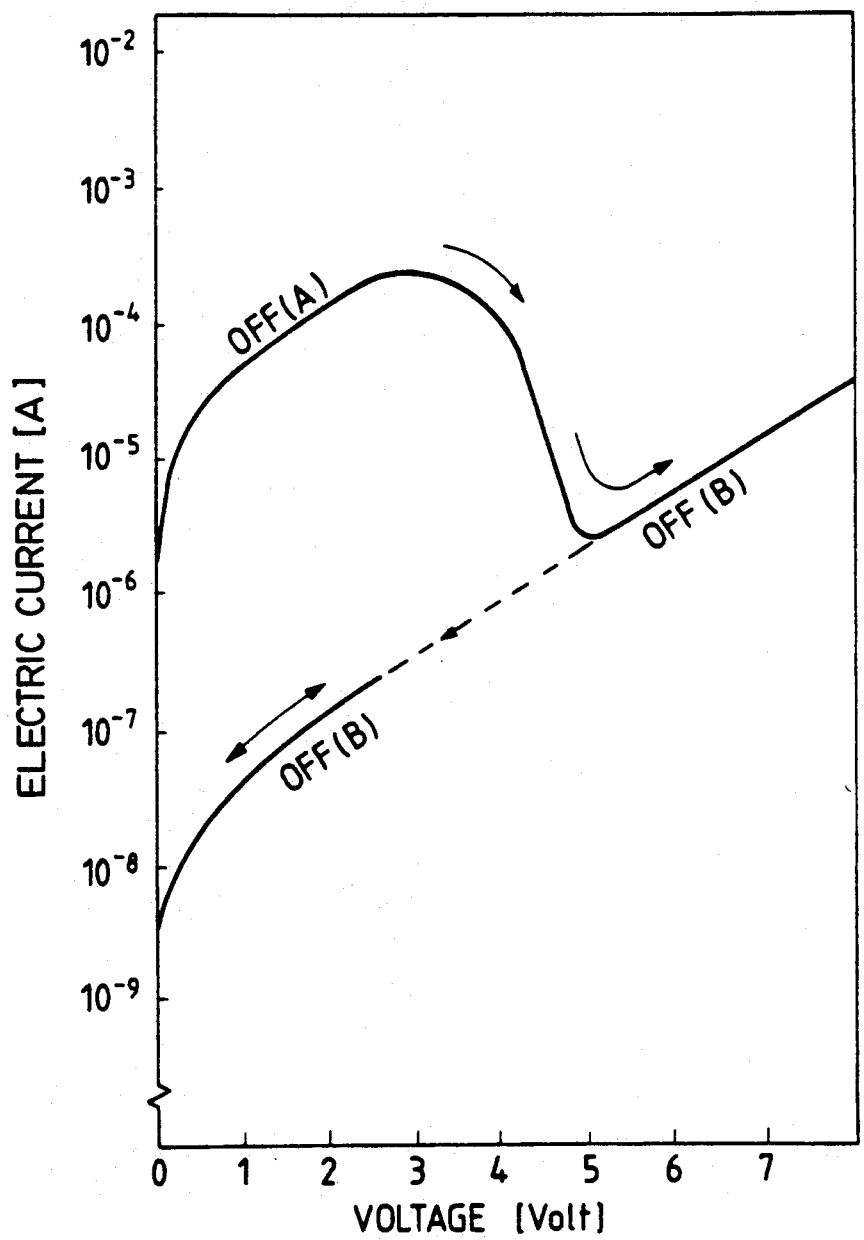
FIG. 2 is a graph showing the characteristics (I-V characteristics) of the switching memorizable MIM device.

FIG. 2 shows the switching memory characteristics (I-V characteristics) of this device. Switching LB-MIM devices generally take three states with different electroconductivities of OFF state [OFF (B) state], MID state [OFF (A) state] and ON state, but here, the specific feature resides in use of the switching memory function between the OFF (B) state and the OFF (A) state. Of course, the present invention is not limited to this, but, for example, the switching memory function between OFF (B) state and ON state may be also employed.

As shown in FIG. 2, such MIM device 11 has switching memory characteristics having OFF (A) state and OFF (B) state and, particularly around 2 V of application voltage, OFF (A) state (state "1") is a resistance value of K$\Omega$ order and OFF (B) state (state "0") that of M$\Omega$ order.

Switching from the state "1" to the state "0" is effected by application of rectangular pulses of 5 V or higher, and the switching from the state "0" to the state "1" by application of rectangular pulses of about 3 V.

In FIG. 1, information transfer from the a device to the b device is effected particularly by switching so that the b device may become also the OFF (A) state if the a device is OFF (A) state, and the b device may become also the OFF (B) state if the a device is OFF (B) state.

EXAMPLE 2

Figure 3A:
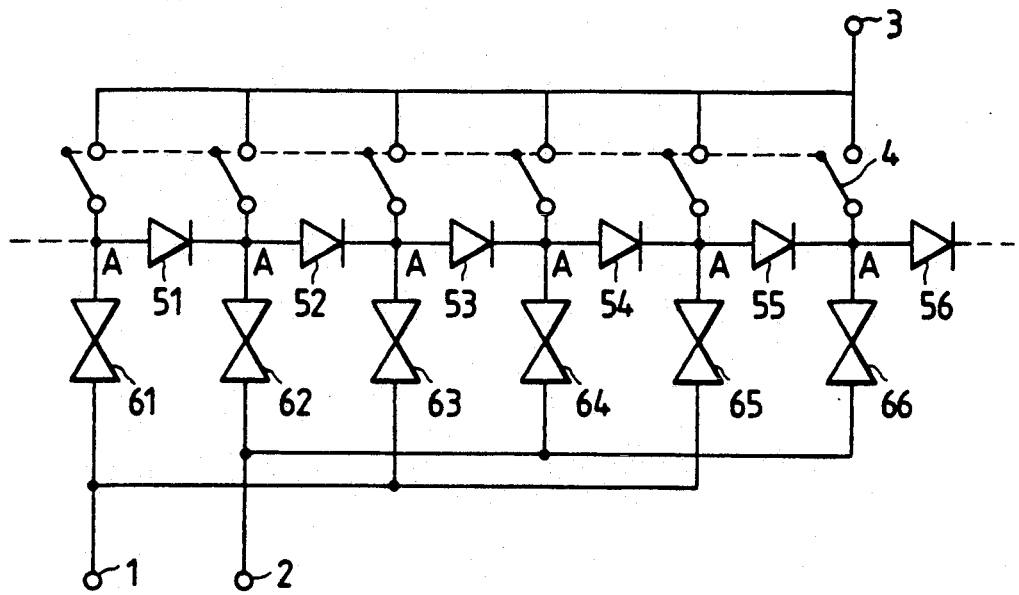
FIG. 3A is a circuit diagram showing an example of the information transfer apparatus of the present invention.

FIG. 3A is a diagram showing an example of the information transfer apparatus which is the present invention, and it is an information transfer apparatus by use of an array (or a plurality of arrays) of a circuit with devices 51 to 56 having rectifiability connected in series, characterized in that one terminal of the two-terminal circuit having the switching LB-MIM devices 61 to 66 is connected to each connecting point A, and that the other device at the odd number is connected to provide a first terminal 1 and that at the even number is connected to provide a second terminal 2, and that the apparatus has a voltage application means capable of taking the disconnected state relative to the above connecting point A.

In FIG. 3A, 4 is a switch enabling the disconnected state, and here particularly a photocoupler switch was employed, but, for example, a conventional electromagnetic system relay may be also employed. 3 is the terminal for applying a voltage on the connecting point A.

Figure 4A:
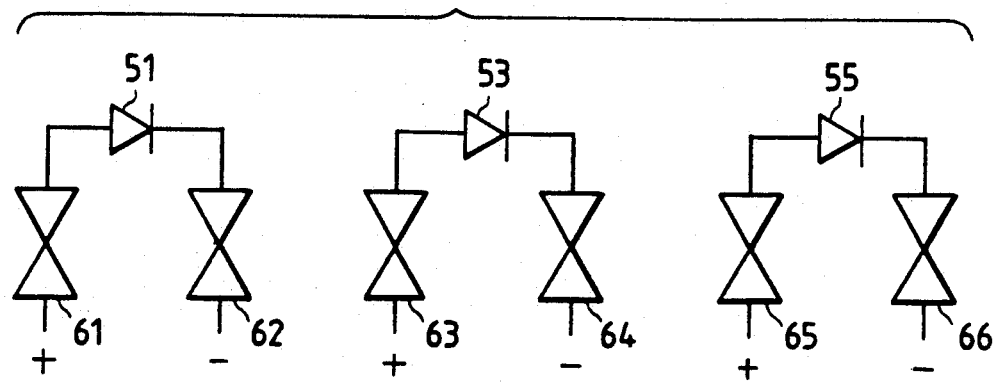
FIGS. 4A and 4B are diagrams for illustration of the principle of the information transfer apparatus.
Figure 4B:
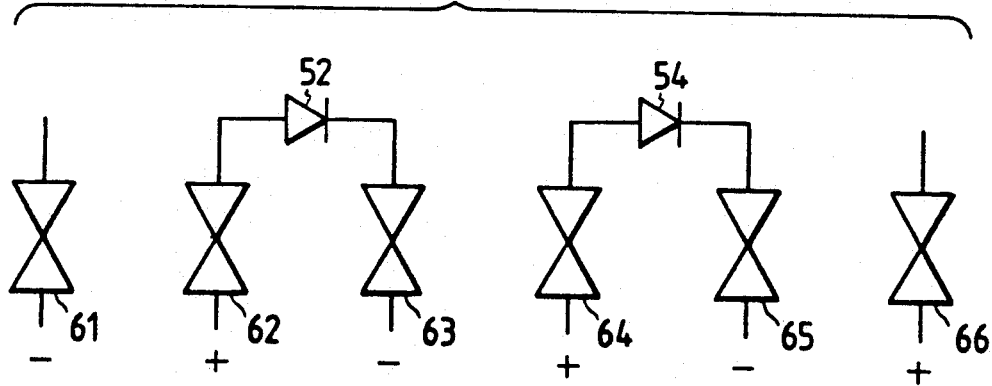

Now, in FIG. 3A, when voltages having polarities different from each other are applied on the first terminal 1 and the second terminal 2, due to the function of the device having rectifiability, as shown in FIGS. 4A and 4B, the portion applied with the voltage of the opposite direction to rectifiability becomes severed state, and only the portion applied with the voltage of the same direction as rectifiability is connected. That is, a circuit comprising a pair of each two of the switching LB-MIM devices of (+)switching LB-MIM device/device having rectifiability/(−) switching LB-MIM device is formed, and the information is transferred from the front device of said pair to the rear device. However, for the information to be correctly transferred, prior to information transfer, it becomes necessary to make the switching LB-MIM device of the information transfer address OFF state (the first state or OFF (B) state) and at the same time hold the information of the switching LB-MIM device of the information transfer source by use of the voltage application means capable of taking the disconnected states comprising 3 and 4 and the first terminal 1 and the second terminal 2.

FIGS. 5A-5D are diagrams for illustration of the calculation function and the information transfer function when a voltage was applied on the a devices and the b devices having the characteristics shown in FIG. 2 connected in series, 5A showing a circuit diagram, 5B a truth table, 5C a chart showing that when a voltage is applied on a circuit having devices of OFF (A) state [state "1"] and OFF (B) state [state "0"] connected in series, most of the voltage is applied to the OFF (B) state, 5D a chart that when a voltage is applied on a circuit having devices of OFF (B) state [state "0"] and OFF (B) state [state "0"], only half voltage (V/2) of the applied voltage (V) is applied on the respective devices.

For switching the characteristics shown in FIG. 2 from the OFF (A) state to the OFF (B) state, the application voltage may be abruptly blocked by application of a voltage of about 5 V or higher, while on the contrary switching from the OFF (B) state to the OFF (A) state effected by application of a voltage of about 3 V.

Therefore, by application of pulses with a peak voltage of about 3 V, it becomes possible to carry out the calculation processing having the a+b (OR) function as shown in FIG. 5B. Hence, by using the b device side as constantly reset to the OFF (B) state [state "0"], the information of the a device can be transferred to the b device.

EXAMPLE 3

Figure 3B:
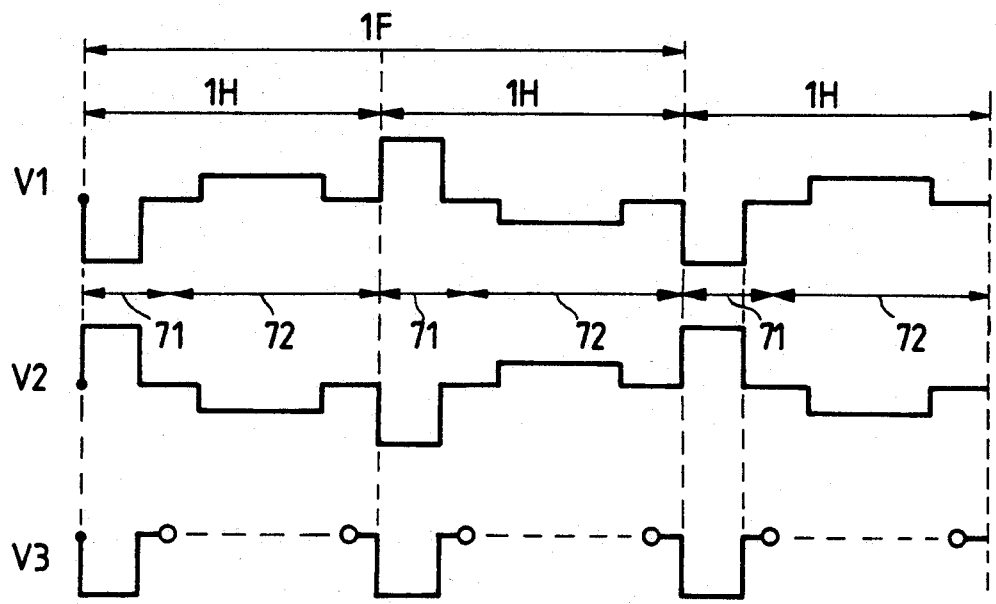
FIG. 3B is a diagram showing an example of the driving method of the information transfer apparatus of the present invention.

FIG. 3B is a diagram showing an example of the driving method of the information transfer device of the present invention.

As shown in the diagram, the method as the specific features in that it has the first period 71 and the second period 72, and in the first period, the switching LB-MIM device of the information transfer address is made the off-state (the first state of the OFF (B) state) and at the same time the voltage for holding the information in the switching LB-MIM device of the information transfer source is applied, while in the second period, the voltage for information transfer is applied.

Particularly, here, the apparatus is characterized by using the switching memory function between the OFF (B) state and the OFF (A) state of the switching LB-MIM device. FIG. 3B is a time chart of the voltage waveforms during application of the voltages V1, V2, V3 respectively on the terminals 1, 2, 3, with 1H=80 msec, 1F=2H being the repetition (1 cycle) units, and by applying repeatedly waveforms corresponding to 1F, the information within the information transfer apparatus shown in FIG. 3A will be gradually transferred.

Here, particularly the peak voltages of V1 and V2 in the first period were made ±4V and ∓4V, and the peak voltage of V3 was made −4V. On the other hand, the peak voltages of V1 and V2 in the second period were made ±1.8V and ∓1.8V, and V3 floating by disconnection with the switch 4. Particularly, as the diodes 51 to 56, a silicon diode with a holding voltage of 0.7 V in the normal direction was employed. Therefore, in the first period within the initial 1H period, the voltage ($V_3-V_1$) applied on the devices 61, 62, 63 become 0 V, whereby the informations are held, while the voltage ($V_3-V_1$) applied on the devices 62, 64, 66 become 8 (=4+4) V, whereby resetting to the OFF (B) state is effected due to stand-up in shape of pulses. In the second period within the initial 1H period, the circuit state as shown in FIG. 4A is formed, and on the devices 62, 64, 65, if 61, 63, 66 of the information transfer sources are in an OFF (A) state, pulse voltages having a peak voltage of about $V1+V2-V_F=3.1$ V are applied, whereby 62, 64, 65 become also OFF (A) state. On the contrary, if 61, 63, 66 of the information transfer sources are in an OFF (B) state, triangular waves having a peak voltage of about $(V1+V2-V_F)/2 \simeq 1.5$ V are applied, whereby OFF (B) state remains as such because the value is lower than the switching threshold value. Thus, information is transferred and memorized between 61→62, 63→64, 65→66.

Similarly in the next 1H, information between 62→63, 64→65 are transfer memorized, and subsequently transfer and memory of information were successively performed by repeated pulses.

EXAMPLE 4

FIG. 6 is a schematic constitutional view showing another embodiment of the information transfer device of the present invention, wherein 11 is the MIM device (switching LB-MIM device) used in Example 1, 12 a device of which electrical resistance varies with temperature, and 13 is a voltage application means.

Here, as the device 12, particularly a CTR-type temperature sensitive semiconductor utilizing a weakly reducible atmosphere sintered product of a VBaP mixture oxide was employed.

The device 2 of which electrical resistance varies with temperature exhibited a low resistance value of about 50Ω under the high temperature state (state "1") with a temperature of 100° C., and had a high resistance value of about 1 MΩ under the low temperature state (state "0") with a temperature of 0° C.

Therefore, in FIG. 6, under the state of the switching LB-MIM device 1 rest at the OFF (B) state, by applying driving pulses with a pulse width of 1 sec., a peak voltage of 3 V by use of a voltage application means 13, when the device 12 is under the high temperature state (state "1"), most of the application voltage is applied on the MIM device 11, whereby such MIM device 11 can be made OFF (A) state (state "1"), while when the device 12 is under the low temperature state (state "0"), the application voltage is divided by resistance to be applied on the MIM device 11, whereby such MIM device 11 can be held as such under the OFF (B) state (state "0").

Thus, the temperature information possessed by the device 112 of which resistance varies with temperature could be transfer memorized to the switching LB-MIM device 11.

EXAMPLE 5

Figure 7:
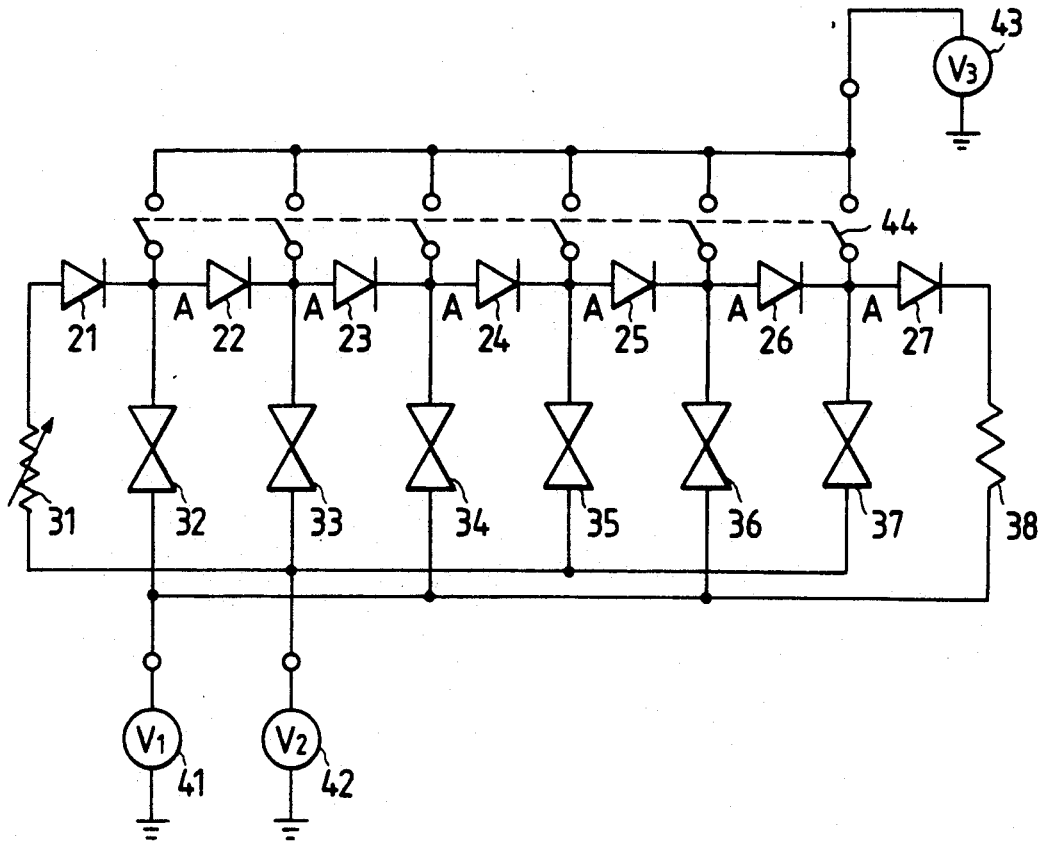
FIG. 7 is a constitutional view showing an example of the present invention.

FIG. 7 is a diagram showing another example of the present invention. In the present example, the information transfer apparatus is characterized by using a circuit B in which switching LB-MIM devices 32 to 37 are arranged at the respective connecting points A of the circuit with the diode devices 21 to 27 connected in series with the rectifying directions aligned from the front top to the rear tail, the device 31 of which resistance varies with temperature is arranged at the front top of the above circuit and the resistor 38 arranged at the rear tail of the above circuit.

By use of such circuit B, the temperature information detected by the device 31 is transferred successively in the rectifying direction of the diodes to be memorized, and by monitoring the voltage at both terminals of the resistor at the rear tails, it has become possible to read the information transfer memorized. In the following, a detailed description is made.

In FIG. 7, 41 and 42 are voltage application means V1 and V2 primarily for information transfer, 43 is voltage application means V3 primarily making the device which becomes the information transfer address among 32 to 37 OFF (B) state (state "0"), and 44 a relay switch for switching the voltage application means 43 into a disconnected state relative to the connecting point A during information transfer.

Figure 8:
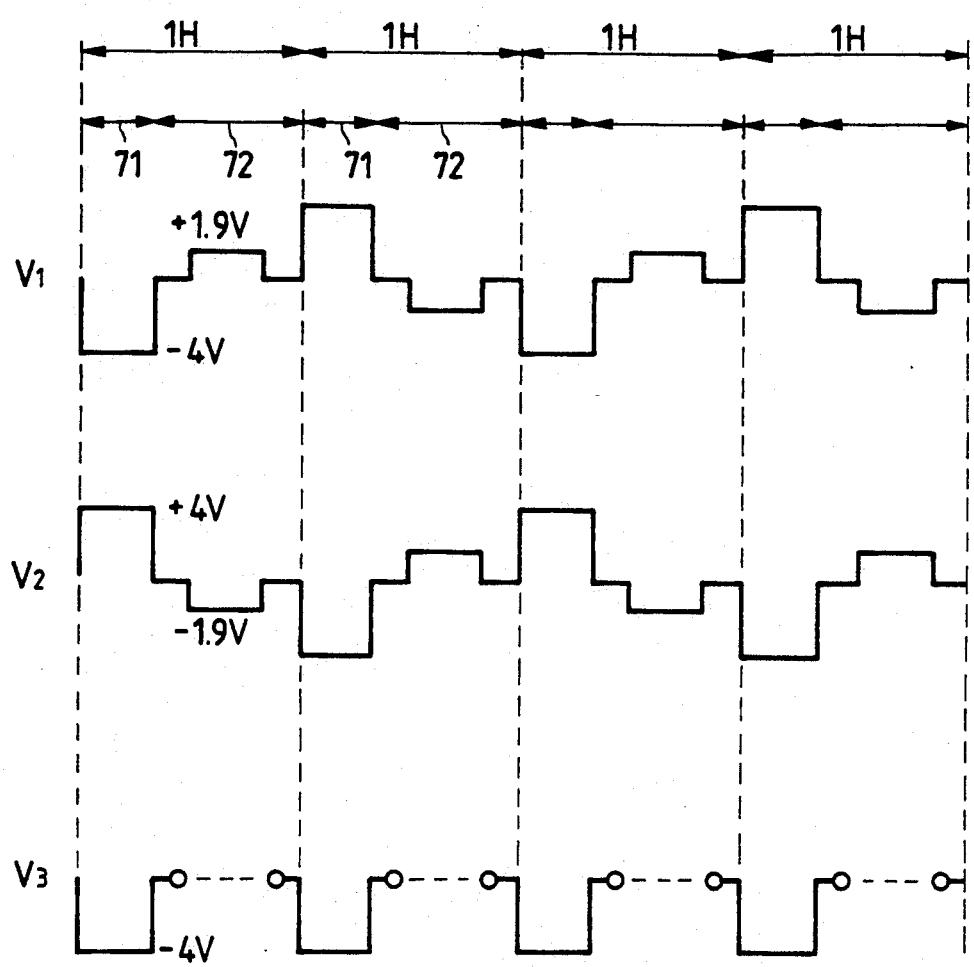
FIG. 8 is a diagram for illustration of the application states of the voltages $V_1$, $V_2$, $V_3$ used in the example.

In such apparatus, by applying repeatedly a voltage characterized by having the first period 71 and the second period 72, different polarities at V1 and V2 from each other and the absolute values V1, V2, V3 of the first interval voltage being equal to each other, as the power sources $V_1$, $V_2$, $V_3$ in FIG. 7 as shown in FIG. 8, transfer recording of information is effected. Here, particularly the resistance of the device 31 under low temperature state, the resistance of the switching LB-MIM devices 21 to 27 under OFF (B) state, and the resistance of the resistor at the circuit terminal are all equal on the MΩ order, and as the diodes 21 to 27, silicone diodes were employed, and as the maintained voltage $V_F$ in the normal direction, 0.7 V, while in the opposite direction, one with sufficiently higher resistance than MΩ were employed.

At this time, when the peak voltage in the first section is made ±4V, and the switch 44 connected state, there is realized the state that every another of the diodes 21 to 27 is applied with a voltage of $V_1-V_2=+8$ V, while no voltage is applied on other devices. In this case, the switching LB-MIM device applied with a voltage of +8 V is reset to the OFF (B) state, to be ready as the information transfer address. On the other hand, the device applied with no voltage continues to hold the information to become the information transfer source.

Next, by making the peak voltages of $V_1$, $V_2$ in the second section ±1.9 V, and V3 disconnected state by use of the relay switch 44, a circuit of high independency is formed between the LB-MIM device of the information transfer source, the diodes in the normal direction and the LB-MIM device of the information address (or resistor at terminal), whereby a voltage of 3.1 (=3.8−0.7)V excluding the maintained voltage $V_F$ (=0.7 V) is applied on the series circuit of LB-MIM and therefore information and recording (excluding resistor at terminal) are effected according to the same principle as in Example 4. Accordingly, by applying repeatedly the waveform as described above while varying alternately the polarities of $V_1$ and $V_2$, the temperature information detected at the device 31 at the tip head portion can be transfer recorded successively toward the rear, and also can be taken out by use of the resistance binder at terminal. However, here 1H comprising the first period and the second period was made 3 sec.

EXAMPLE 6

Figure 9:
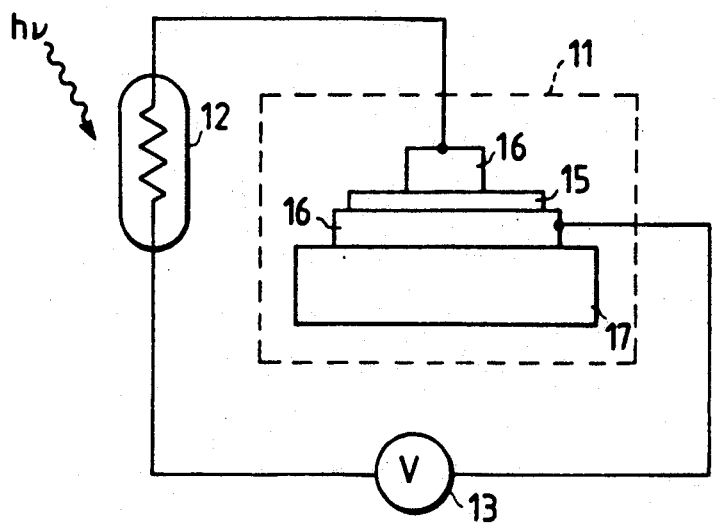
FIG. 9 is a diagram showing the basic constitution of the apparatus according to another embodiment of the present invention.

FIG. 9 shows another embodiment of the apparatus of the present invention. It is the same as the apparatus shown in FIG. 6 except that a photoconductive device 12 was employed as the device of which electrical resistance varies depending on the input electrical information.

As the photoconductive device 12, one utilizing the photoconductive effect of CdS, and having the resistance in a dark state when no light is irradiated (dark resistance) of about 1 MΩ, and the resistance for the light resistance when light is irradiated (light resistance) of about 1 KΩ was employed.

At this time, in FIG. 9, under the state where the switching LB-MIM device 11 is reset to OFF (B) state, by applying rectangular pulses with a pulse width of 1 sec., a peak voltage 3 V from the voltage application means 13, when the photoconductive device 12 is under light state (state "1"), most of the application voltage is applied on the MIM device 1, whereby the MIM device 11 can be made OFF (A) state (state "1"), while when the photoconductive device 12 is under dark state (state "0"), the application voltage is resistance divided (or capacitance divided) before applied on the MIM device 11, whereby the MIM device 11 can be held as such under the OFF (B) state (state "0").

Thus, the information concerning presence or absence of photoirradiation possessed by the photoconductive device 12 could be transfer memorized into the switching LB-MIM device.

EXAMPLE 7

In Example 5, except for using the photoconductive device in Example 6 in place of the device 31 of which resistance varies with temperature, the apparatus constitution was made the same as in Example 5.

By use of such circuit B, by transferring and memorizing successively the information under light state and dark state detected by the photoconductive device 31 toward the rectifying direction and at the same time monitoring the voltages at both terminals of the resistor 38, the information transfer memorized could be read.

EXAMPLE 8

Figure 10:
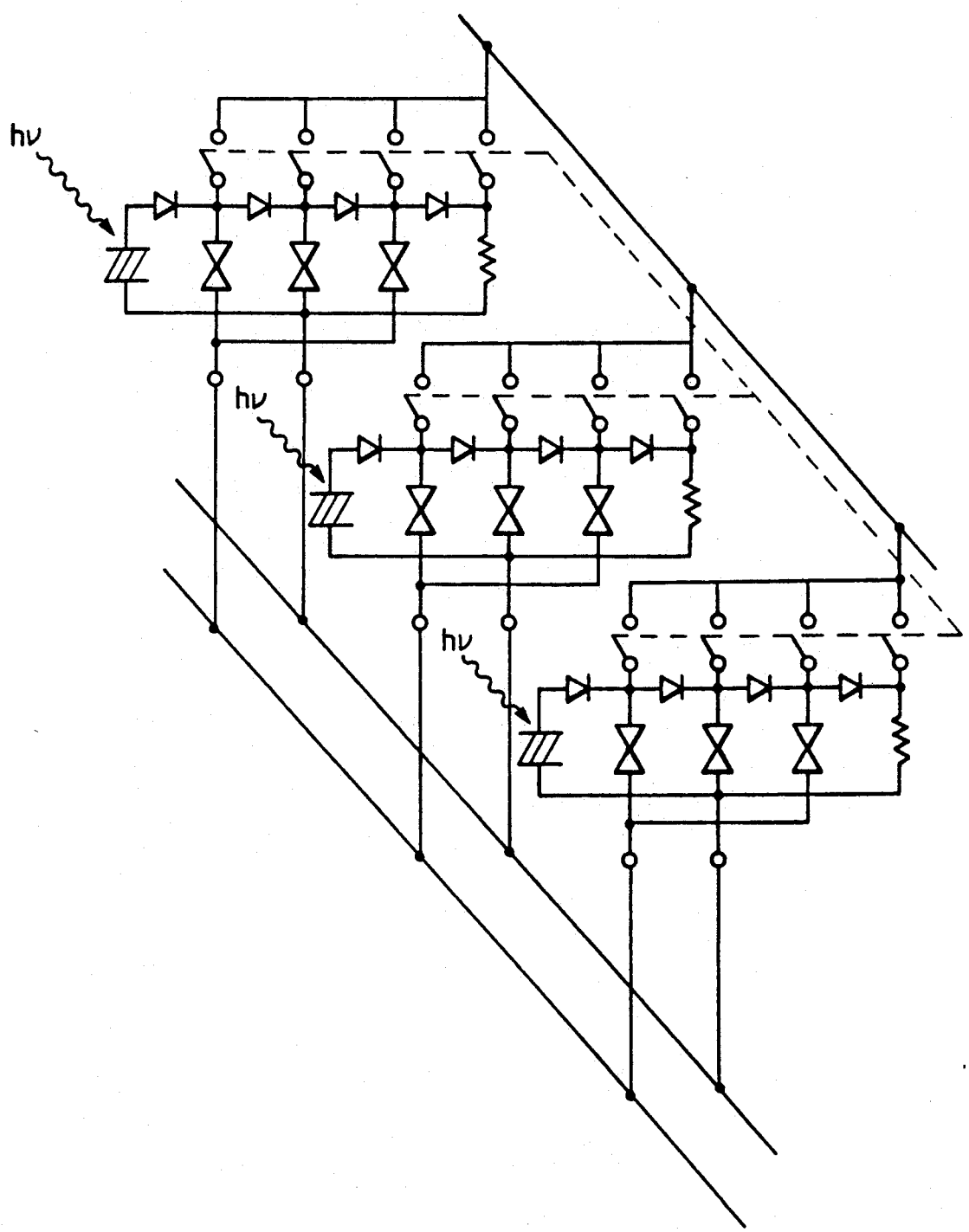
FIG. 10 is a constitutional view showing another embodiment of the present invention.

FIG. 10 is an example of the present invention, and is characterized by using a plurality of the circuits B described in Example 7.

Here, particularly by arranging the photoconductive devices in a line, an information transfer apparatus having multi-functions of line sensor, line shift register, interface for external reading, etc. is realized.

Of course, the present invention is limited by line arrangement, but, for example, by constituting a plurality of circuits B having photoconductive devices arranged in planar shape in bulk shape or bundle type, an information apparatus provided with all of area sensor, area shift register, interface for external reading is realized.

EXAMPLE 9

Figure 11:
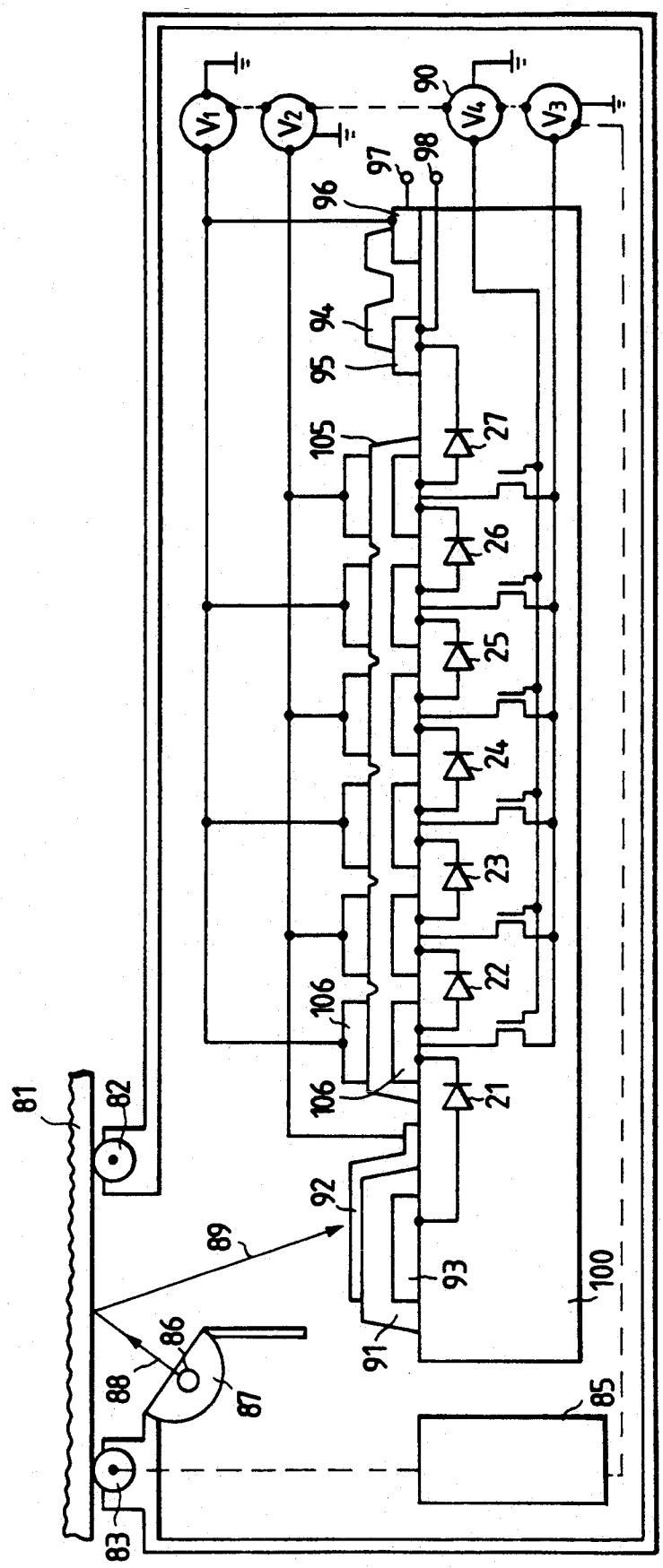
FIG. 11 is a constitutional view showing another embodiment of the present invention.

FIG. 11 is a schematic view showing an example of the present invention.

This example is an information transfer apparatus comprising a movement amount detection device 83, a linear light source 86 and an optical system which inputs light reflected against said linear light source 86 into a photoconductive device.

By moving the present apparatus on a paper surface 81 having an image information and performing information transfer operation corresponding to 1H described in detail in Example 5 relative to the appropriate movement amount detected by the movement amount detecting apparatus 83, the image information on the paper surface 81 is successively transfer memorized, and the image information can be read out, if necessary.

Here, to describe in detail about such apparatus, in FIG. 11, 100 consists of a plurality of circuits B having the photoconductive devices described in Example 8 in a line, and here the specific feature resides in that the disconnecting switch for the power source V3 is formed particularly by use of Thin Film Transistor (TFT), and opening and closing of the TFT portion is controlled by the power source V4. 91 is a Cds thin film sandwiched by the metal electrodes 92,93, and photoconductive devices are constituted of 91 to 93, and arranged in a line in the direction vertical to the paper surface to form an optical line sensor.

105 is an LB film similar to the LB film 15 shown in Example 6, and sandwiched between the metal electrodes 106, thus constituting a plurality of switching LB-MIM devices.

94 is a carbon resistance for information reading by use of 95 and 96 as the electrodes, 97, 98 are terminals for reading connected thereto, and similar terminals are formed in a line vertically to the paper surface. On the other hand, 87 is a reflection plate for the linear light source 86, which is a part of the optical system by irradiating a light source on the paper surface following the incident light pathway 88 and inputting the reflected light corresponding to the shade of the paper surface into the line sensor portion comprising 91 to 93.

For the movement amount detection device 83, one having a rotatory portion and detecting the movement amount on the paper surface by rotation of said rotatory portion was employed.

82 is a rotatory member for realizing smooth movement on the paper surface.

85 is a control apparatus, and as shown by the dotted line, corresponding to the movement amount read by 83, the voltages of V1-V4 are controlled to perform control for transferring and memorizing the image on the paper surface 81 effectively into the information transfer apparatus 100.

EXAMPLE 10

Figure 12:
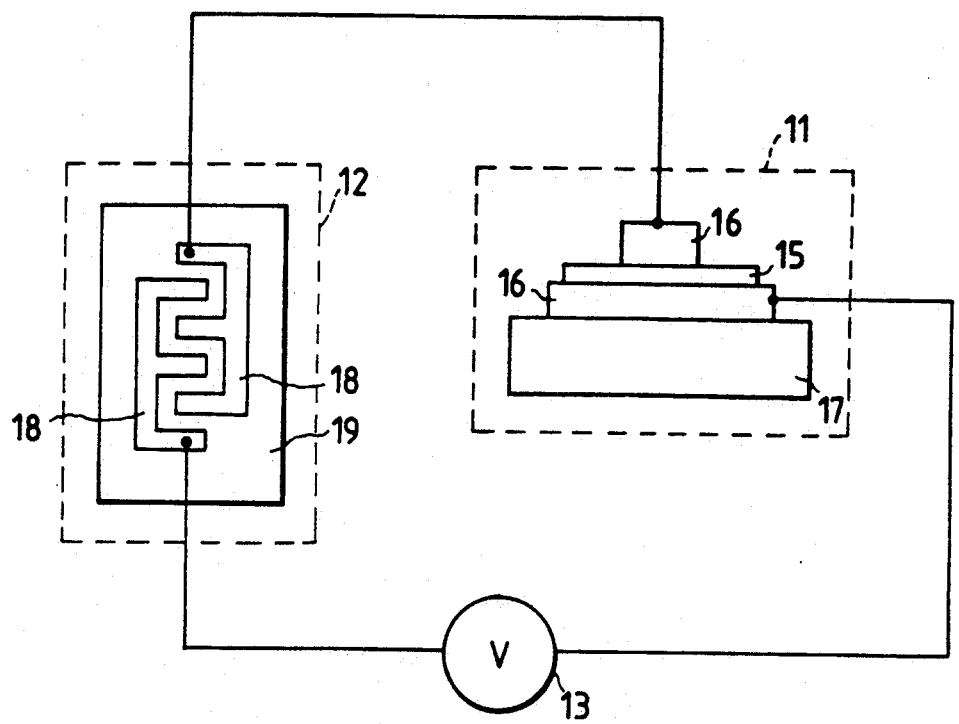
FIG. 12 is a diagram showing the basic constitution of the apparatus according to another embodiment of the present invention.

FIG. 12 shows the apparatus according to another embodiment of the present invention.

Except for using a device of which electrical resistance varies with humidity as the device which varies depending on the inputted information, it is the same as the apparatus shown in FIG. 6 (Example 4).

Here, as the device 12, particularly, there was employed one obtained by placing powder of α-Fe$_2$CO$_3$ added with 13 mol % of K$_2$CO$_3$ in a crucible of high purity alumina, calcining it at 1300° C. for 2 hours, forming the calcined powder made to have size of 1 μm or less into paste with addition of an organic binder, which was then coated on an alumina substrate 19 provided with a comb-shaped electrode 18.

The device 12 of which electrical resistance varies with humidity exhibits a low resistance value of about 1KΩ at a high humidity state with a humidity of 50% (state "1"), and a high resistance value of about 1 MΩ at a low resistance state with a humidity of 10% (state "0").

Therefore, in FIG. 12, by applying a driving pulse with a pulse width of 1 sec., a peak voltage of 3 V by use of a voltage application means 13 under the state where switching LB-MIM device 11 is reset at OFF (B) state (state "0"), when the device 12 is under the high humidity state (state "1"), most of the applied voltage is applied on the MIM device 11, whereby such MIM device can be made OFF (A) state (state "1"), while when the device 12 is under low humidity state (state "0"), the applied voltage is resistance divided to be applied on the MIM device 11, whereby such MIM device 11 can be held as such under the OFF (B) state (state "0").

Thus, the humidity information possessed by the device 12 of which resistance varies with humidity could be transfer memoried to the switching LB-MIM device 11.

Example 11 in Example 5, except for using the device of which resistance varies with humidity in Example 10 in place of the device of which resistance varies with temperature, the apparatus constitution was made the same as in Example 5.

By use of such circuit B, the humidity information detected by the device 31 could be successively transferred and memoried in the rectifying direction and at the same time the information transferred monitored could be read by monitoring the voltage at the both terminals of the rear resistor 38.

As described above, according to the present invention, even if the power source voltage may be made OFF state, it has become possible to store information semi-permanently within the switching LB-MIM device, whereby the state stored can be again transferred as desired by making against the power source ON state.

As described above, according to the information transfer apparatus of the present invention, by transferring input information in the device of which resistance varies with input information such as temperature, light, humidity, etc. to the switching LB-MIM device to be memoried therein, an information transfer apparatus in which information can be stored semi-permanently even if the power source voltage may be made OFF state can be realized.

We claim:

1. An information transfer method, which comprises connecting a plurality of MIM devices comprising a monomolecular film of an organic compound or built-up films thereof as an insulating layer and having a switching memory function, and transferring information on a side nearer to an oscillation source of the information, which information is recognized as a difference between resistance states in the MIM devices, every second bit or every second line or every second picture face successively to a side farther from the oscillation source.

2. An information transfer method according to claim 1, wherein said MIM device can take at least two states with different electroconductivities.

3. An information transferring method, which comprises transferring an information in an electrical circuit having a devices and b devices which are MIM devices comprising a monomolecular film of an organic compound or built-up films thereof as an insulating layer and having a switching memory function arrayed alternately in a row or in a plurality of rows, wherein a memory in the b devices is erased to effect information transmission from the a device positioned immediately before the b device to the b device, and subsequently a memory in the a device is erased to effect information transmission from the b device positioned immediately before the a device to the a device.

4. An information transfer method according to claim 3, wherein said MIM device can take at least two states with different electroconductivities.

5. An information transfer apparatus comprising using an array or a plurality of arrays of circuits with devices having rectifiability connected in series with rectifying directions being aligned, connecting one terminal of a two-terminal circuit having an MIM device having switching memory function to each connecting point A, connecting the other terminal of every odd number to provide a second terminal, and having a voltage application means capable of taking a disconnected state relative to said connecting point A.

6. An information transfer apparatus according to claim 5, wherein said MIM device can take at least two states with different electroconductivities.

7. An information transfer apparatus according to claim 5, further comprising means for applying a voltage having polarities different from each other for transferring information.

8. An information transfer apparatus according to claim 7, wherein by use of the voltage application means capable of taking the disconnected state and said first and second terminals, the apparatus is made such that the MIM device which is an information transfer address is made an OFF state simultaneously with holding the MIM device of an information transfer source.

9. An information transfer apparatus according to claim 5, wherein the device having rectifiability is a diode.

10. An information transfer apparatus according to claim 5, wherein by use of the voltage application means capable of taking the disconnected state and said first and second terminals, the apparatus is made such that the MIM device which is an information transfer address is made an OFF state simultaneously with holding of the MIM device of an information transfer source.

11. An information transfer apparatus according to claim 5, wherein an MIM device comprises a monomolecular film of an organic compound or built-up films thereof as an insulating layer and has a switching memory function.

12. An information transfer apparatus according to claim 5, further comprising a circuit having a photoconductive device.

13. A method for driving an information transfer apparatus comprising an array or a plurality of arrays of circuits with devices having rectifiability connected in series with rectifying directions being aligned, connecting one terminal of a two-terminal circuit having an MIM device having switching memory function to each connecting point A, connecting the other terminal of every odd number to provide a second terminal, and having a voltage application means capable of taking a disconnected state relative to the connecting point A, said method comprising the steps of;

applying a voltage for making a MIM device of an information transfer address under a first state simultaneously with holding information of a MIM device of an information transfer source; and applying a voltage for information transfer.

14. An information transfer apparatus, comprising an MIM device comprising a monomolecular film of an organic compound or built-up films thereof as an insulating film and having a switching memory function at each connecting point of a circuit with devices having rectifiability connected with their rectifying directions aligned, a circuit with a device of which electrical resistance varies depending on input information arranged on one end thereof and a resistor on the other end, respectively, and a voltage application means.

15. An information transfer apparatus according to claim 14, wherein the device having rectifiability is a diode.

16. An information transfer apparatus according to claim 14, wherein said MIM device can take at least two states with different electroconductivities.

17. An information transfer apparatus comprising an MIM device comprising a monomolecular film of an organic compound or built-up films thereof as an insulating layer and having a switching memory function, a circuit having a device of which electrical resistance varies with temperature connected thereto and a voltage application means.

18. An information transfer apparatus according to claim 17, wherein said MIM device can take at least two states with different electroconductivities.

19. An information transfer apparatus, comprising an MIM device comprising a monomolecular film of an organic compound or built-up films thereof as an insulating film and having a switching memory function arranged at each connecting point of a circuit with devices having rectifiability connected with their rectifying directions aligned, a circuit with a device of which electrical resistance varies with temperature arranged on one end thereof and a resistor on the other end, respectively, and a voltage application means.

20. An information transfer apparatus according to claim 19, wherein the device having rectifiability is a diode.

21. An information transfer apparatus according to claim 19, wherein said MIM device can take at least two states with different electroconductivities.

22. An information transfer apparatus, comprising an MIM device comprising a monomolecular film of an organic compound or built-up films thereof as an insulating film and having a switching memory function arranged at each connecting point of a circuit with devices having rectifiability connected with their rectifying directions aligned, a circuit with a photoconductive device arranged on one end thereof and a resistor on the other end, respectively, and a voltage application means.

23. An information transfer apparatus according to claim 22, wherein the device having rectifiability is a diode.

24. An information transfer apparatus according to claim 22, wherein said MIM device can take at least two states with different electroconductivities.

25. An information transfer apparatus according to claim 24, further comprising a plurality of said circuits.

26. An information transfer apparatus, comprising an MIM device comprising a monomolecular film of an organic compound or built-up films thereof as an insulating film and having a switching memory function arranged at each connecting point of a circuit with devices having rectifiability connected with their rectifying directions aligned, a circuit with a photoconductive device arranged on one end thereof and a resistor on the other end, respectively, a voltage application means, an information holding member having an image information, a movement amount detecting device for detecting a movement amount of said information holding member, a linear light source and an optical system for inputting the image information into the photoconductive device by reflecting the light from said linear light source.

27. An information transfer apparatus according to claim 26, wherein the device having rectifiability is a diode.

28. An information transfer apparatus according to claim 26, wherein said MIM device can take at least two states with different electroconductivities.

29. An information transfer apparatus, comprising a monomolecular film of an organic compound or built-up films thereof as an insulating layer and having a switching memory function, a circuit having a device of which electrical resistance varies with humidity connected thereto and a voltage application means.

30. An information transfer apparatus according to claim 29, wherein said MIM device can take at least two states with different electroconductivities.

31. An information transfer apparatus, comprising and MIM device comprising a monomolecular film of an organic compound or built-up films thereof as an insulating film and having a switching memory function arranged at each connecting point of a circuit with devices having rectifiability connected with their rectifying directions aligned, a circuit with a device of which electrical resistance varies with humidity arranged on one end thereof and a resistor on the other end, respectively, and a voltage application means.

32. An information transfer apparatus according to claim 31, wherein the device having rectifiability is a diode.

33. An information transfer apparatus according to claim 31, wherein said MIM device can take at least two states with different electroconductivities.

* * * * *

UNITED STATES PATENT AND TRADEMARK OFFICE
CERTIFICATE OF CORRECTION

PATENT NO. : 5,274,475

DATED : December 28, 1993

INVENTOR(S) : HIDEYUKI KAWAGISHI ET AL.  Page 1 of 3

It is certified that error appears in the above-identified patent and that said Letters Patent is hereby corrected as shown below:

On the title page: Item

[30] FOREIGN APPLICATION PRIORITY DATA

Insert, --March 5, 1991 [JP] Japan..........3-62364--.

COLUMN 1

Line 9, "an" should be deleted.
　　Line 17, "a MIM" should read --an MIM--.

COLUMN 2

Line 39, "therminal" should read --terminal--.
　　Line 56, "varied" should read --varies--.

COLUMN 3

Line 35, "photoconductive" should read --photoconductive device--.
　　Line 45, "photoconductive" should read --photoconductive device--.

COLUMN 5

Line 13, "skelton" should read --skeleton--.

COLUMN 7

Line 52, "nal I" should read --nal 1--.

UNITED STATES PATENT AND TRADEMARK OFFICE
CERTIFICATE OF CORRECTION

PATENT NO.  : 5,274,475
DATED       : December 28, 1993
INVENTOR(S) : HIDEYUKI KAWAGISHI ET AL.

It is certified that error appears in the above-identified patent and that said Letters Patent is hereby corrected as shown below:

COLUMN 8

Line 56, "$\pm 4V$ and $\mp 4V$" should read --$\mp 4V$ and $\pm 4V$--.

COLUMN 9

Line 37, "rest" should read --reset--.
Line 50, "device 112" should read --device 12--.

COLUMN 10

Line 30, "connected" should read --in a connected--.
Line 31, "another" should read --other--.

COLUMN 13

Line 9, "in" should read --In--.
Line 25, "against" should read --again--.

UNITED STATES PATENT AND TRADEMARK OFFICE
CERTIFICATE OF CORRECTION

PATENT NO. : 5,274,475
DATED : December 28, 1993
INVENTOR(S) : HIDEYUKI KAWAGISHI ET AL.

It is certified that error appears in the above-identified patent and that said Letters Patent is hereby corrected as shown below:

<u>COLUMN 16</u>

Line 2, "claim 24," should read --claim 22,--.
    Line 35, "and" should read --an--.

Signed and Sealed this

Sixteenth Day of August, 1994

Attest:

BRUCE LEHMAN

Attesting Officer      Commissioner of Patents and Trademarks